(12) United States Patent
Marrani et al.

(10) Patent No.: US 9,751,967 B2
(45) Date of Patent: *Sep. 5, 2017

(54) VINYLIDENE FLUORIDE AND TRIFLUOROETHYLENE POLYMERS

(75) Inventors: Alessio Marrani, Lecco (IT); Giulio Brinati, Milan (IT)

(73) Assignee: SOLVAY SPECIALTY POLYMERS ITALY S.P.A., Bollate (Milan) (IT)

( * ) Notice: Subject to any disclaimer, the term of this patent is extended or adjusted under 35 U.S.C. 154(b) by 0 days.

This patent is subject to a terminal disclaimer.

(21) Appl. No.: 13/996,018

(22) PCT Filed: Dec. 13, 2011

(86) PCT No.: PCT/EP2011/072507
§ 371 (c)(1),
(2), (4) Date: Jun. 20, 2013

(87) PCT Pub. No.: WO2012/084579
PCT Pub. Date: Jun. 28, 2012

(65) Prior Publication Data
US 2013/0296512 A1    Nov. 7, 2013

(30) Foreign Application Priority Data
Dec. 22, 2010 (EP) .................................... 10196549

(51) Int. Cl.
*C08F 214/22* (2006.01)
(52) U.S. Cl.
CPC ........ *C08F 214/225* (2013.01); *C08F 214/22* (2013.01)
(58) Field of Classification Search
CPC ................ C08F 214/225; C08F 214/22; C08F 214/186; C08F 2220/281
See application file for complete search history.

(56) References Cited

U.S. PATENT DOCUMENTS

| | | | |
|---|---|---|---|
| 3,080,347 A | 3/1963 | Sandberg et al. | |
| 3,194,796 A | 7/1965 | Squire | |
| 3,242,218 A | 3/1966 | Miller | |
| 3,318,850 A | 5/1967 | Stilmar | |
| 3,665,041 A | 5/1972 | Sianesi et al. | |
| 3,715,378 A | 2/1973 | Sianesi et al. | |
| 4,098,978 A * | 7/1978 | Mikofalvy et al. | 526/81 |
| 4,342,675 A * | 8/1982 | Gangal | 524/762 |
| 4,523,039 A | 6/1985 | Lagow et al. | |
| 4,611,260 A | 9/1986 | Bauer | |
| 4,684,337 A | 8/1987 | Bauer | |
| 4,861,851 A | 8/1989 | Miyabayashi et al. | |
| 4,990,283 A | 2/1991 | Visca et al. | |
| 5,087,679 A | 2/1992 | Inukai et al. | |
| 5,095,072 A | 3/1992 | Kobayashi et al. | |
| 5,278,694 A | 1/1994 | Wheatley et al. | |
| 5,334,333 A | 8/1994 | Goetz | |
| 5,447,982 A | 9/1995 | Kamba et al. | |
| 5,498,680 A | 3/1996 | Abusleme et al. | |
| 6,103,843 A | 8/2000 | Abusleme et al. | |
| 6,228,533 B1 | 5/2001 | Ohashi et al. | |
| 6,355,749 B1 | 3/2002 | Chung et al. | |
| 6,730,762 B2 | 5/2004 | Lousenberg et al. | |
| 6,780,966 B2 | 8/2004 | Wu et al. | |
| 6,790,932 B2 | 9/2004 | Kapeliouchko et al. | |
| 6,803,419 B2 | 10/2004 | Tsuda et al. | |
| 6,872,503 B2 | 3/2005 | Wheland et al. | |
| 7,101,925 B2 | 9/2006 | Malvasi et al. | |
| 7,101,944 B2 | 9/2006 | Rajagopalan | |
| 7,122,608 B1 | 10/2006 | Brinati et al. | |
| 7,615,600 B2 | 11/2009 | Capron et al. | |
| 8,575,286 B2 * | 11/2013 | Brinati ................ C08F 214/182 526/209 |
| 9,441,054 B2 * | 9/2016 | Stanga .................... C08F 14/22 |

(Continued)

FOREIGN PATENT DOCUMENTS

| | | |
|---|---|---|
| CA | 786877 A | 6/1968 |
| EP | 0148482 B1 | 3/1992 |

(Continued)

OTHER PUBLICATIONS

Isner-Brom, P., et al—"Intrinsic Piezoelectric Characterization of PVDF Copolymers: Determination of Elastic Constants", 1995, Ferroelectrics, vol. 171, pp. 271-279—Overseas Publishers Association, Amsterdam B.V., Published under license by Gordon and Breach Science Publishers SA.; 9 pgs.

(Continued)

*Primary Examiner* — Nicole M Buie-Hatcher
(74) *Attorney, Agent, or Firm* — Osha Liang LLP

(57) ABSTRACT

The present invention pertains to a fluoropolymer [polymer (F)] comprising:
recurring units derived from vinylidene fluoride (VDF);
from 10% to 50% by moles of recurring units derived from trifluoroethylene (TrFE); and
from 0.01% to 10% by moles of recurring units derived from at least one (meth)acrylic monomer [monomer (MA)] having formula (I) here below:

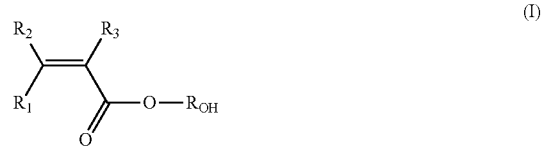

(I)

wherein:
$R_1$, $R_2$ and $R_3$, equal to or different from each other, are independently selected from a hydrogen atom and a $C_1$-$C_3$ hydrocarbon group, and
$R_{OH}$ represents a hydrogen atom or a $C_1$-$C_5$ hydrocarbon moiety comprising at least one hydroxyl group.
The invention also pertains to a process for the manufacture of said polymer (F) and to use of said polymer (F) as ferroelectric, piezoelectric, pyroelectric or dielectric material in electrical and electronic devices.

13 Claims, No Drawings

(56) References Cited

U.S. PATENT DOCUMENTS

| | | | |
|---|---|---|---|
| 2006/0235175 | A1 | 10/2006 | Baradie et al. |
| 2007/0149694 | A1 | 6/2007 | Krishnan |
| 2007/0244262 | A1 | 10/2007 | Zhang et al. |
| 2008/0081195 | A1* | 4/2008 | Chung et al. ............... 428/421 |
| 2008/0171804 | A1 | 7/2008 | Krishnan |
| 2008/0182125 | A1 | 7/2008 | Krishnan et al. |
| 2008/0233062 | A1 | 9/2008 | Krishnan |
| 2009/0274912 | A1 | 11/2009 | Bonnet |
| 2009/0326337 | A1* | 12/2009 | Solin et al. ................. 600/300 |
| 2010/0133482 | A1* | 6/2010 | Abusleme et al. .......... 252/511 |
| 2010/0255378 | A1 | 10/2010 | Bonnet et al. |

FOREIGN PATENT DOCUMENTS

| | | |
|---|---|---|
| EP | 1452551 A1 | 9/2004 |
| EP | 1621573 A1 | 2/2006 |
| EP | 2133370 A1 | 12/2009 |
| FR | 2890971 A1 | 3/2007 |
| GB | 1226566 A | 3/1971 |
| JP | 57-137308 A | 8/1982 |
| JP | 58-095753 A | 6/1983 |
| WO | WO 8700538 A1 | 1/1987 |
| WO | WO 2008017789 A2 | 2/2008 |
| WO | WO 2008041998 A1 | 4/2008 |
| WO | WO 2008079986 A1 | 7/2008 |
| WO | WO 2008129041 A1 | 10/2008 |
| WO | WO 2009147030 A1 | 12/2009 |
| WO | WO 2012084578 A1 | 6/2012 |

OTHER PUBLICATIONS

Bauer, F., et al—"Very high pressure behavior of precisely-poled PVDF", Ferroelectrics, 1995, vol. 171, pp. 95-102—Overseas Publishers Association, Amsterdam B.V., Published under license by Gordon and Breach Science Publishers SA ; 8 pgs.

Pianca, M., et al—"End groups in fluoropolymers", 1999, Journal of Fluorine Chemistry, vol. 95, Elsevier Science S.A., pp. 71-84; 14 pgs.

Kochnev, I. G., et al—"Change in the surface properties of Ftorlons by the radiation grafting of methacrylic acid", 1973, Plasticheskie Massy, vol. 8, pp. 12-13, 3 pgs, Includes abstract in English.

Petersohn, E., et al—"Characterization of radiation grafted PVDF and P(VDF/TrFE) films", 1993, Thin Films, Proc. Jt. 4th Int. Symp. Trends New Appl. Thin Films 11th Conf. High Vac., Interfaces Thin Films. Editor(s): Hecht, G.; Richter, F.; Hahn, J. Publisher: DGM Informationsges., Oberursel, Germany; pp. 650-653; 4 pgs.

Petersohn, E., et al—"Modification of phase transitions in swift heavy ion irradiated and MMA-grafted ferroelectric fluoropolymers", 1995, Nuclear Instruments & Methods in Physics Research, Section B: Beam Interactions with Materials and Atoms, vol. 105, Issue Nos. 1-4, Elsevier Science BV pp. 267-274; 8 pgs.

Kimura, T., et al—"Preparation of Poly(vinylidene fluoride-co-trifluoroethylene) Film with a Hydrophilic Surface by Direct Surface-initiated Atom Transfer Radical Polymerization without Pretreatment", 2009, Chemistry Letters, vol. 38, Issue No. 5, The Chemical Society of Japan, pp. 446-447; 2 pgs.

Green, J., et al—"Nitroso Rubber Research, Development and Production", 1965, Defense Documentation Center for Scientific and Technical Information, Cameron Station Alexandria, VA, AD463777 (unclassified), Feb. 28, 1965, Thiokol Chemical Corp Denville, NJ Reaction Motors Div; pp. 1-22; 30 pgs.

Zhang, H., et al—"Microstructure and electromechanical responses in semicrystalline ferroelectric relaxor polymer blends", 2006, Journal of Applied Physics, vol. 100.044113, pp. 044113-1 thru 044113-7, doi:10.1063/1.2335778—American Institute of Physics; 7 pgs.

Omote, K., et al—"Shear piezoelectric properties of vinylidene fluoride trifluoroethylene copolymer, and its application to transverse ultrasonic transducers", 1995, Appl. Phys. Letters, vol. 66, Issue No. 17, pp. 2215-2217—doi:10.1063/1.113171—American Institute of Physics; 3 pgs.

Reynolds, J.R.—"Polymer Films with Enhanced Dielectric Properties. Final Report", 1993, U.S. Army Research Office, DAAL03-90-G-0149, University of Florida, Defense Technical Information Centre—ADA271148—Jul. 26, 1993, Approved for publish release, 10 pgs.

U.S. Appl. No. 13/995,275, filed Jun. 18, 2013, Milena Stanga, et al.

* cited by examiner

VINYLIDENE FLUORIDE AND TRIFLUOROETHYLENE POLYMERS

CROSS-REFERENCE TO RELATED APPLICATIONS

This application is a U.S. national stage entry under 35 U.S.C. 371 of International Application No. PCT/EP2011/072507 filed Dec. 13, 2011, which claims priority to European application No. 10196549.9 filed on Dec. 22, 2010, the whole content of this application being incorporated herein by reference for all purposes.

TECHNICAL FIELD

The present invention relates to vinylidene fluoride copolymers and compositions thereof, to a process for the manufacture of said copolymers and to use of said copolymers in electrical and electronic devices.

BACKGROUND ART

Vinylidene fluoride copolymers comprising recurring units derived from trifluoroethylene monomers have been used extensively in the electronics packaging market due to their ease of processing, chemical inertness and attractive ferroelectric, piezoelectric, pyroelectric and dielectric properties.

As is well known, the term piezoelectric means the ability of a material to exchange electrical for mechanical energy and vice versa and the electromechanical response is believed to be essentially associated with dimensional changes during deformation or pressure oscillation. The piezoelectric effect is reversible in that materials exhibiting the direct piezoelectric effect (the production of electricity when stress is applied) also exhibit the converse piezoelectric effect (the production of stress and/or strain when an electric field is applied).

Ferroelectricity is the property of a material whereby this latter exhibits a spontaneous electric polarization, the direction of which can be switched between equivalent states by the application of an external electric field.

Pyroelectricity is the ability of certain materials to generate an electrical potential upon heating or cooling. Actually, as a result of this change in temperature, positive and negative charges move to opposite ends through migration (i.e. the material becomes polarized) and hence an electrical potential is established.

It is generally understood that piezo-, pyro-, ferro-electricity in copolymers of vinylidene fluoride with trifluoroethylene is related to a particular crystalline habit, so called beta-phase, wherein hydrogen and fluorine atoms are arranged to give maximum dipole moment per unit cell.

Copolymers comprising recurring units derived from vinylidene fluoride and trifluoroethylene are typically provided as semicrystalline copolymers which can be shaped or formed into semicrystalline, essentially unoriented and unstretched, thermoplastic film or sheet or tubular-constructed product via well known processing methods such as extrusion, injection moulding, compression moulding and solvent casting.

For instance, WO 2009/147030 (SOLVAY SOLEXIS S.P.A.) Dec. 10, 2009 discloses polymers comprising recurring units derived from vinylidene fluoride and trifluoroethylene, said polymers comprising end groups of formula —$CF_2H$ and/or —$CF_2CH_3$ in an amount of at least 60 mmoles per Kg of vinylidene fluoride recurring units, which exhibit improved flexibility and deformability while maintaining outstanding piezoelectric, ferroelectric, pyroelectric and dielectric properties to be suitable for use in electrical and electronic devices.

Also, U.S. Pat. No. 5,087,679 (DAIKIN INDUSTRIES LTD.) Feb. 11, 1992 discloses use as dielectrics of copolymers comprising from 60% to 79% by moles of recurring units derived from vinylidene fluoride, from 18% to 22% by moles of recurring units derived from trifluoroethylene and from 3% to 22% by moles of recurring units derived from chlorotrifluoroethylene.

However, the vinylidene fluoride copolymers of the prior art do not satisfy critical electrical requirements to meet the required performance criteria for highly demanding high power electronics and microelectronics applications.

To ensure proper operation of a high power electronic circuit, in particular of a high power electronic circuit in a miniature form, proper isolation must be ensured between adjacent conductors by means of well performing insulating dielectric polymeric materials. High voltage arcing and leakage currents represent typical problems encountered in high voltage circuits, in particular when operating at high frequencies.

To counter these effects, dielectric polymeric materials which may be advantageously shaped into thin films and sheets need to be developed which exhibit high values for breakdown voltage or dielectric strength.

As is known, breakdown voltage or dielectric strength of an insulator defines the minimum voltage that causes a portion of the insulator to become electrically conductive. In solid insulating materials, this usually creates a weakened path within the material by creating permanent molecular or physical changes by the sudden electric current.

Additionally, the vinylidene fluoride copolymers of the prior art suffer from poor adhesive strength to substrates, in particular to metal substrates, to be advantageously used in electronic applications.

There is thus still a need in the art for vinylidene fluoride copolymer materials which fulfil such antagonist requirements and are endowed with improved values for breakdown voltage or dielectric strength, while also exhibiting good or enhanced adhesive strength properties to substrates, in particular to metal substrates, and maintaining outstanding thermal stability values and piezoelectric, ferroelectric, pyroelectric and dielectric properties.

SUMMARY OF INVENTION

It is thus an object of the present invention a fluoropolymer [polymer (F)] comprising:
recurring units derived from vinylidene fluoride (VDF);
from 10% to 50% by moles of recurring units derived from trifluoroethylene (TrFE); and
from 0.01% to 10% by moles of recurring units derived from at least one (meth)acrylic monomer [monomer (MA)] having formula (I) here below:

wherein:
$R_1$, $R_2$ and $R_3$, equal to or different from each other, are independently selected from a hydrogen atom and a $C_1$-$C_3$ hydrocarbon group, and $R_{OH}$ represents a hydrogen atom or a $C_1$-$C_5$ hydrocarbon moiety comprising at least one hydroxyl group.

The Applicant has surprisingly found that the polymer (F) of the invention is advantageously endowed with improved values for breakdown voltage, while also exhibiting very good thermal stability properties and adhesive strength to substrates, in particular to metal substrates such as copper and aluminum, and retaining typical piezoelectric, ferroelectric, pyroelectric and dielectric properties of the polymers of the prior art to be successfully used in high power electronics and microelectronics applications.

The polymer (F) of the invention comprises preferably from 15% to 48% by moles, more preferably from 16% to 45% by moles, even more preferably from 17% to 40% by moles of recurring units derived from trifluoroethylene (TrFE).

The (meth)acrylic monomer [monomer (MA)] preferably complies with formula (II) here below:

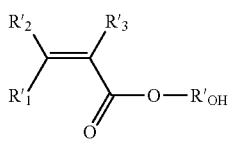
(II)

wherein:
- $R'_1$ and $R'_2$, equal to or different from each other, are independently selected from a hydrogen atom and a $C_1$-$C_3$ hydrocarbon group, preferably $R'_1$ and $R'_2$ being hydrogen atoms,
- $R'_3$ is a hydrogen atom, and
- $R'_{OH}$ represents a hydrogen atom or a $C_1$-$C_5$ hydrocarbon moiety comprising at least one hydroxyl group.

Non-limitative examples of (meth)acrylic monomers (MA) notably include acrylic acid, methacrylic acid, hydroxyethyl(meth)acrylate, hydroxypropyl(meth)acrylate, hydroxyethylhexyl(meth)acrylate.

The monomer (MA) is more preferably selected from the followings:

hydroxyethylacrylate (HEA) of formula:

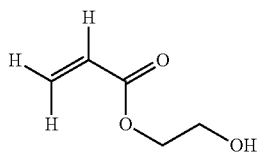

2-hydroxypropyl acrylate (HPA) of either of formulae:

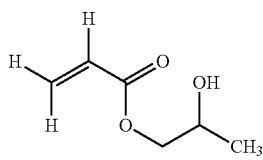

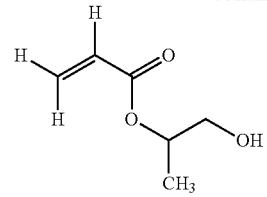

acrylic acid (AA) of formula:

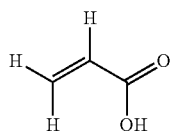

and mixtures thereof.

The monomer (MA) is even more preferably acrylic acid (AA) or hydroxyethylacrylate (HEA).

The polymer (F) of the invention may further comprise recurring units derived from one or more other fluorinated comonomers [comonomer (F)].

The term "fluorinated comonomer [comonomer (F)]" is hereby intended to denote an ethylenically unsaturated comonomer comprising at least one fluorine atom.

The comonomer (F) may further comprise one or more other halogen atoms such as chlorine, bromine and iodine atoms.

Non-limitative examples of suitable comonomers (F) notably include the followings:

(i) $C_2$-$C_8$ perfluoroolefins such as tetrafluoroethylene (TFE) and hexafluoropropylene (HFP);

(ii) perfluoroalkylethylenes of formula $CH_2=CH-R_{f0}$, wherein $R_{f0}$ is a $C_2$-$C_6$ perfluoroalkyl group;

(iii) chloro- and/or bromo- and/or iodo-$C_2$-$C_6$ fluoroolefins such as chlorotrifluoroethylene (CTFE);

(iv) perfluoroalkylvinylethers of formula $CF_2=CFOR_{f1}$, wherein $R_{f1}$ is a $C_1$-$C_6$ perfluoroalkyl group, such as perfluoromethylvinylether (PMVE) and perfluoropropylvinylether (PPVE);

(v) (per)fluorooxyalkylvinylethers of formula $CF_2=CFOX_0$, wherein $X_0$ is a $C_1$-$C_{12}$ oxyalkyl group or a $C_1$-$C_{12}$ (per)fluorooxyalkyl group having one or more ether groups, e.g. perfluoro-2-propoxy-propyl group;

(vi) (per)fluoroalkylvinylethers of formula $CF_2=CFOCF_2OR_{f2}$, wherein $R_{f2}$ is a $C_1$-$C_6$ (per)fluoroalkyl group, e.g. $-CF_3$, $-C_2F_6$, $-C_3F_7$, or a $C_1$-$C_6$ (per)fluorooxyalkyl group having one or more ether groups, e.g. $-C_2F_6-O-CF_3$;

(vii) functional (per)fluorooxyalkylvinylethers of formula $CF_2=CFOY_0$, wherein $Y_0$ is selected from a $C_1$-$C_{12}$ alkyl group or (per)fluoroalkyl group, a $C_1$-$C_{12}$ oxyalkyl group and a $C_1$-$C_{12}$ (per)fluorooxyalkyl group having one or more ether groups, $Y_0$ comprising a carboxylic or sulfonic acid group, in its acid, acid halide or salt form;

(viii) fluorodioxoles, especially perfluorodioxoles.

The comonomer (F) is preferably free of hydrogen atoms.

Most preferred fluorinated comonomers (F) are chlorotrifluoroethylene (CTFE), perfluoromethylvinylether (PMVE), tetrafluoroethylene (TFE), hexafluoropropylene (HFP).

Should the fluorinated comonomer (F) be present, the polymer (F) of the invention comprises typically from 2% to 20% by moles, preferably from 3% to 18% by moles, more preferably from 4% to 15% by moles of recurring units derived from said fluorinated comonomer (F).

The polymer (F) of the invention is typically semi-crystalline.

The term "semi-crystalline" is hereby intended to denote a polymer having a heat of fusion typically of from 10 to 90 J/g, preferably of from 30 to 60 J/g, more preferably of from 35 to 55 J/g as measured according to ASTM D3418-08.

The melt flow index (MFI) of the polymer (F) of the invention will be selected by the skilled in the art in relation to the processing technology chosen for obtaining final parts (e.g. films or sheets).

It is nevertheless generally understood that the polymer (F) will have a MFI as measured according to ASTM D1238 (230° C., 5 Kg) of advantageously at most 500 g/10 min, preferably of at most 200 g/10 min, more preferably of at most 50 g/10 min.

The polymer (F) backbone is typically interrupted by short chain branches terminated by end groups having formulae —$CF_2H$ and/or —$CF_2CH_3$, which typically originate from intra-chain transfer (back-biting) during radical polymerization as shown in the scheme here below:

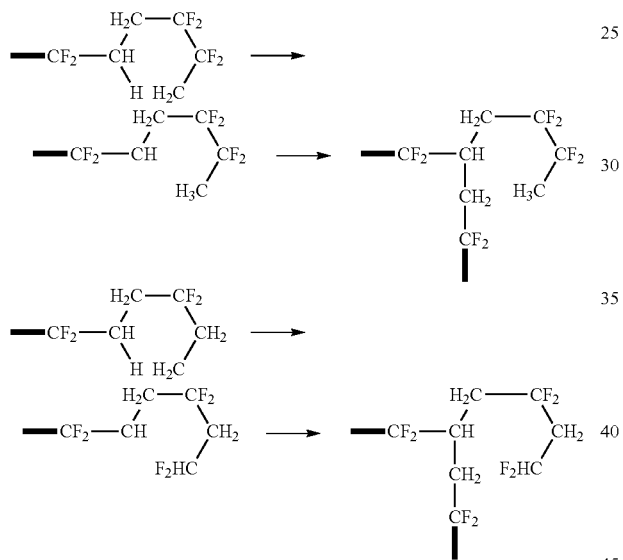

According to a first preferred embodiment of the invention, the polymer (F) comprises end groups of formula —$CF_2H$ and/or —$CF_2CH_3$ in an amount of less than 30 mmoles per Kg of vinylidene fluoride (VDF) recurring units, preferably of less than 20 mmoles per Kg of VDF recurring units [polymer (F-1)].

The polymer (F-1) of this first preferred embodiment of the invention comprises preferably at least 0.02% by moles, more preferably at least 0.04% by moles of recurring units derived from at least one (meth)acrylic monomer (MA) having formula (I) as described above.

The polymer (F-1) of this first preferred embodiment of the invention comprises preferably at most 8% by moles, more preferably at most 5% by moles of recurring units derived from at least one (meth)acrylic monomer (MA) having formula (I) as described above.

According to a second preferred embodiment of the invention, the polymer (F) comprises end groups of formula —$CF_2H$ and/or —$CF_2CH_3$ in an amount of at least 30 mmoles per Kg of vinylidene fluoride (VDF) recurring units [polymer (F-2)].

Very good results have been obtained with polymers (F-2) according to this second preferred embodiment of the invention comprising end groups of formula —$CF_2H$ and/or —$CF_2CH_3$ in an amount of advantageously at least 40 mmoles per Kg of VDF recurring units, preferably of at least 50 mmoles per Kg of VDF recurring units.

The polymer (F-2) of this second preferred embodiment comprises preferably from 0.01% to 1% by moles, more preferably from 0.02% to 0.8% by moles, even more preferably from 0.04% to 0.6% by moles of recurring units derived from at least one (meth)acrylic monomer (MA) having formula (I) as described above.

According to a first variant of this second preferred embodiment of the invention, the polymer (F-2) consists of:
  from 40% to 85% by moles, preferably from 45% to 83% by moles of recurring units derived from vinylidene fluoride (VDF),
  from 10% to 50% by moles, preferably from 15% to 48% by moles of recurring units derived from trifluoroethylene (TrFE), and
  from 0.01% to 1% by moles, preferably from 0.02% to 0.8% by moles of recurring units derived from at least one (meth)acrylic monomer (MA) having formula (I) as described above.

According to a second variant of this second preferred embodiment of the invention, the polymer (F-2) consists of:
  from 40% to 85% by moles, preferably from 45% to 80% by moles of recurring units derived from vinylidene fluoride (VDF),
  from 10% to 50% by moles, preferably from 15% to 48% by moles of recurring units derived from trifluoroethylene (TrFE),
  from 2% to 20% by moles, preferably from 4% to 15% by moles of recurring units derived from chlorotrifluoroethylene (CTFE), and
  from 0.01% to 1% by moles, preferably from 0.02% to 0.8% by moles of recurring units derived from at least one (meth)acrylic monomer (MA) having formula (I) as described above.

The polymer (F) of the invention is preferably selected from polymers (F-2) according to the second preferred embodiment of the invention.

Another object of the present invention is a process for the manufacture of the polymer (F) as defined above.

The polymer (F) can be manufactured either by an aqueous suspension polymerization process or by an aqueous emulsion polymerization process.

The polymer (F) is preferably manufactured by an aqueous emulsion polymerization process, said process comprising polymerizing vinylidene fluoride (VDF), trifluoroethylene (TrFE), at least one (meth)acrylic monomer (MA) having formula (I) as described above and, optionally, one or more other fluorinated comonomers (F) as defined above in the presence of at least one radical initiator in a polymerization medium comprising:
  water,
  at least one fluorinated surfactant [surfactant (FS)], and
  at least one non-functional perfluoropolyether (PFPE) oil.

The aqueous emulsion polymerization process of the present invention advantageously yields homogeneously dispersed nano-sized droplets in a kinetically stable, optically transparent, isotropic aqueous composition, at room temperature, stabilized by an interfacial film of fluorinated surfactant molecules [surfactant (FS)].

The Applicant has found that the aqueous emulsion polymerization process of the present invention is particularly suitable for manufacturing the polymer (F-2) of the invention, as it enables achieving suitable polymerization rates at limited overall pressure.

Polymerization pressure ranges typically between 10 and 45 bar, preferably between 15 and 40 bar, more preferably between 20 and 35 bar.

The skilled in the art will choose the polymerization temperature having regards, inter alia, of the radical initiator used. Polymerization temperature is generally selected in the range comprised between 80° C. and 140° C., preferably between 95° C. and 130° C.

While the choice of the radical initiator is not particularly limited, it is understood that those suitable for the process according to the invention are selected from compounds capable of initiating and/or accelerating the polymerization process.

Inorganic radical initiators may be used and include, but are not limited to, persulfates such as sodium, potassium and ammonium persulfates, permanganates such as potassium permanganate.

Also, organic radical initiators may be used and include, but are not limited to, the followings: acetylcyclohexanesulfonyl peroxide; diacetylperoxydicarbonate; dialkylperoxydicarbonates such as diethylperoxydicarbonate, dicyclohexylperoxydicarbonate, di-2-ethylhexylperoxydicarbonate; tert-butylperneodecanoate; 2,2'-azobis(4-methoxy-2,4-dimethylvaleronitrile; tert-butylperpivalate; dioctanoylperoxide; dilauroyl-peroxide; 2,2'-azobis(2,4-dimethylvaleronitrile); tert-butylazo-2-cyanobutane; dibenzoylperoxide; tert-butyl-per-2-ethylhexanoate; tert-butylpermaleate; 2,2'-azobis (isobutyronitrile); bis(tert-butyl peroxy)cyclohexane; tert-butyl-peroxyisopropylcarbonate; tert-butylperacetate; 2,2'-bis(tert-butylperoxy)butane; dicumyl peroxide; di-tert-amyl peroxide; di-tert-butyl peroxide (DTBP); p-methane hydroperoxide; pinane hydroperoxide; cumene hydroperoxide; and tert-butyl hydroperoxide.

Other suitable radical initiators notably include halogenated radical initiators such as chlorocarbon based and fluorocarbon based acyl peroxides such as trichloroacetyl peroxide, bis(perfluoro-2-propoxy propionyl) peroxide, $[CF_3CF_2CF_2OCF(CF_3)COO]_2$, perfluoropropionyl peroxides, $(CF_3CF_2CF_2COO)_2$, $(CF_3CF_2COO)_2$, $\{(CF_3CF_2CF_2)-[CF(CF_3)\ CF_2O]_m-CF(CF_3)-COO\}_2$ wherein m=0-8, $[ClCF_2(CF_2)_nCOO]_2$, and $[HCF_2(CF_2)_n COO]_2$ wherein n=0-8; perfluoroalkyl azo compounds such as perfluoroazoisopropane, $[(CF_3)_2CFN=]_2$, $R^\alpha N=NR^\alpha$, wherein $R^\alpha$ is a linear or branched perfluorocarbon group having 1-8 carbons; stable or hindered perfluoroalkane radicals such as hexafluoropropylene trimer radical, $[(CF_3)_2CF]_2(CF_2CF_2)C$. radical and perfluoroalkanes.

Redox systems, comprising at least two components forming a redox couple, such as dimethylaniline-benzoyl peroxide, diethylaniline-benzoyl peroxide and diphenylamine-benzoyl peroxide may also be used as radical initiators to initiate the polymerization process.

Organic radical initiators as defined above are preferred. Among them, the peroxides having a self-accelerating decomposition temperature (SADT) higher than 50° C. are particularly preferred, such as for instance: di-tert-butyl peroxide (DTBP), diterbutylperoxyisopropylcarbonate, terbutyl(2-ethyl-hexyl)peroxycarbonate, terbutylperoxy-3,5,5-trimethylhexanoate.

According to an embodiment of the process of the invention, a mixture of one or more organic radical initiators as defined above and one or more inorganic radical initiators as defined above, preferably ammonium persulfate, is advantageously used to accelerate the polymerization process.

The radical initiator is added to the polymerization medium of the process of the invention in an amount ranging advantageously from 0.001% to 20% by weight of the polymerization medium as defined above.

Polymerization is typically carried out in the presence of a chain transfer agent. The chain transfer agent is generally selected from those known in the polymerization of fluorinated monomers such as ketones, esters, ethers or aliphatic alcohols having from 3 to 10 carbon atoms like, e.g., acetone, ethylacetate, diethylether, methyl-ter-butyl ether, isopropyl alcohol; chloro(fluoro)carbons, optionally containing hydrogen, having from 1 to 6 carbon atoms, like, e.g., chloroform, trichlorofluoromethane; bis(alkyl)carbonates wherein the alkyl has from 1 to 5 carbon atoms like, e.g., bis(ethyl)carbonate, bis(isobutyl)carbonate. The chain transfer agent may be fed to the polymerization medium at the beginning, continuously or in discrete amounts (step-wise) during the polymerization, continuous or stepwise feeding being preferred.

Emulsion polymerization processes as detailed above have been described in the art (see e.g. U.S. Pat. No. 4,990,283 (AUSIMONT SPA (IT)) Feb. 5, 1991, U.S. Pat. No. 5,498,680 (AUSIMONT SPA) Mar. 12, 1996 and U.S. Pat. No. 6,103,843 (AUSIMONT SPA) Aug. 15, 2000).

By "non-functional perfluoropolyether (PFPE) oil" it is hereby intended to denote a perfluoropolyether (PFPE) oil comprising non-functional end groups.

The non-functional end groups of the perfluoropolyether (PFPE) oil are generally selected from fluoro(halo)alkyls having 1 to 3 carbon atoms, optionally comprising one or more halogen atoms different from fluorine or hydrogen atoms, e.g. $CF_3-$, $C_2F_5-$, $C_3F_6-$, $ClCF_2CF(CF_3)-$, $CF_3CFClCF_2-$, $ClCF_2CF_2-$, $ClCF_2-$.

The non-functional PFPE oil used in the process of the invention typically comprises a (per)fluoropolyoxyalkylene chain [chain $(R_f)$] comprising recurring units, equal to or different from each other, having general formula $-(CJJ')_j-CKK'-O-$, wherein J and J', equal to or different from each other, independently represent a fluorine atom or a $C_1$-$C_6$ (per)fluoro(oxy)alkyl group, K and K', equal to or different from each other, independently represent a hydrogen atom, a fluorine atom, a chlorine atom or a $C_1$-$C_6$ (per)fluoro(oxy)alkyl group and j is an integer comprised between 0 and 3, said recurring units being generally statistically distributed along the (per)fluoropolyoxyalkylene chain [chain $(R_f)$].

The non-functional PFPE oil used in the process of the invention has a number average molecular weight advantageously comprised between 400 and 3000, preferably between 600 and 1500.

The non-functional PFPE oil is preferably selected from the followings:

$$T^1-O-[CF(CF_3)CF_2O]_{b1'}(CFYO)_{b2'}-T^{1'} \qquad (1)$$

wherein:
T$^1$ and equal to or different from each other, are independently selected from $-CF_3$, $-C_2F_5$ and $-C_3F_7$ groups;
Y, equal or different at each occurrence, is selected from a fluorine atom and a $-CF_3$ group;
b1' and b2', equal to or different from each other, are independently integers ≥0 such that the b1'/b2' ratio is comprised between 20 and 1000 and the (b1'+b2') sum is comprised between 5 and 250; should b1' and b2' be both different from zero, the different recurring units are generally statistically distributed along the perfluoropolyoxyalkylene chain.

Said products can be obtained by photooxidation of $C_3F_6$ as described in CA 786877 (MONTEDISON S.P.A.) Jun. 4, 1968 and by subsequent conversion of the end groups as described in GB 1226566 (MONTECATINI EDISON S.P.A.) Mar. 31, 1971.

$$T^1\text{-O}\text{---}[CF(CF_3)CF_2O]_{c1'}(C_2F_4O)_{c2'}(CFYO)_{c3'}\text{-}T^{1'} \quad (2)$$

wherein:
$T^1$ and $T^{1'}$, equal to or different from each other, have the same meaning as defined above;

Y, equal or different at each occurrence, has the same meaning as defined above;

c1', c2' and c3', equal to or different from each other, are independently integers $\geq 0$ such that the (c1'+c2'+c3') sum is comprised between 5 and 250; should at least two of c1', c2' and c3' be different from zero, the different recurring units are generally statistically distributed along the perfluoropolyoxyalkylene chain.

Said products can be manufactured by photooxidation of a mixture of $C_3F_6$ and $C_2F_4$ and subsequent treatment with fluorine as described in U.S. Pat. No. 3,665,041 (MONTECATINI EDISON S.P.A.) May 23, 1972.

$$T^1\text{-O}\text{---}(C_2F_4O)_{d1'}(CF_2O)_{d2'}\text{-}T^{1'} \quad (3)$$

wherein:
$T^1$ and $T^{1'}$, equal to or different from each other, have the same meaning as defined above;

d1' and d2', equal to or different from each other, are independently integers $\geq 0$ such that the d1'/d2' ratio is comprised between 0.1 and 5 and the (d1'+d2') sum is comprised between 5 and 250; should d1 and d2' be both different from zero, the different recurring units are generally statistically distributed along the perfluoropolyoxyalkylene chain.

Said products can be produced by photooxidation of $C_2F_4$ as reported in U.S. Pat. No. 3,715,378 (MONTECATINI EDISON S.P.A.) Feb. 6, 1973 and subsequent treatment with fluorine as described in U.S. Pat. No. 3,665,041 (MONTECATINI EDISON S.P.A.) May 23, 1972.

$$T^2\text{-O}\text{---}[CF(CF_3)CF_2O]_{e'}\text{-}T^{2'} \quad (4)$$

wherein:
$T^2$ and $T^{2'}$, equal to or different from each other, are independently selected from $-C_2F_5$ and $-C_3F_7$ groups;

e' is an integer comprised between 5 and 250.

Said products can be prepared by ionic hexafluoropropylene epoxide oligomerization and subsequent treatment with fluorine as described in U.S. Pat. No. 3,242,218 (E. I. DU PONT DE NEMOURS AND CO.) Mar. 22, 1966.

$$T^2\text{-O}\text{---}(CF_2CF_2O)_{f'}\text{-}T^{2'} \quad (5)$$

wherein:
$T^2$ and $T^{2'}$, equal to or different from each other, have the same meaning as defined above;

f' is an integer comprised between 5 and 250.

Said products can be obtained by a method comprising fluorinating a polyethyleneoxide, e.g. with elemental fluorine, and optionally thermally fragmentating the so-obtained fluorinated polyethyleneoxide as reported in U.S. Pat. No. 4,523,039 (THE UNIVERSITY OF TEXAS) Jun. 11, 1985.

$$T^1\text{-O}\text{---}(CF_2CF_2C(Hal')_2O)_{g1'}\text{---}(CF_2CF_2CH_2O)_{g2'}\text{---}(CF_2CF_2CH(Hal')O)_{g3'}\text{-}T^{1'} \quad (6)$$

wherein:
$T^1$ and $T^{1'}$, equal to or different from each other, have the same meaning as defined above;

Hal', equal or different at each occurrence, is a halogen selected from fluorine and chlorine atoms, preferably a fluorine atom;

g1', g2', and g3', equal to or different from each other, are independently integers $\geq 0$ such that the (g1'+g2'+g3') sum is comprised between 5 and 250; should at least two of g1', g2' and g3' be different from zero, the different recurring units are generally statistically distributed along the (per)fluoropolyoxyalkylene chain.

Said products may be prepared by ring-opening polymerizing 2,2,3,3-tetrafluorooxethane in the presence of a polymerization initiator to give a polyether comprising repeating units of the formula: $-CH_2CF_2CF_2O-$, and optionally fluorinating and/or chlorinating said polyether, as detailed in EP 148482 B (DAIKIN INDUSTRIES LTD.) Mar. 25, 1992.

$$R^1_f\text{-}\{C(CF_3)_2\text{---}O\text{---}[C(R^2)_2]_{j1'}C(R^2)_2\text{---}O\}_{j2'}\text{-}R^1_f \quad (7)$$

wherein:
$R^1_f$, equal or different at each occurrence, is a $C_1$-$C_6$ perfluoroalkyl group;

$R^2_f$, equal or different at each occurrence, is selected from a fluorine atom and a $C_1$-$C_6$ perfluoroalkyl group;

j1' is equal to 1 or 2;

j2' is an integer comprised between 5 and 250.

Said products can be produced by the copolymerization of hexafluoroacetone with an oxygen-containing cyclic comonomer selected from ethylene oxide, propylene oxide, epoxy-butane and/or trimethylene oxide (oxethane) or substituted derivatives thereof and subsequent perfluorination of the resulting copolymer, as detailed in patent application WO 87/00538 (LAGOW ET AL.) Jan. 29, 1987.

The non-functional PFPE oil is more preferably selected from the followings:

(1') non-functional PFPE oils commercially available from Solvay Solexis S.p.A. under the trademark names GALDEN® and FOMBLIN®, said PFPE oils generally comprising at least one PFPE oil complying with either of formulae here below:

$$CF_3\text{---}[(OCF_2CF_2)_m\text{---}(OCF_2)_n]\text{---}OCF_3$$

m+n=40-180; m/n=0.5-2

$$CF_3\text{---}[(OCF(CF_3)CF_2)_p\text{---}(OCF_2)_q]\text{---}OCF_3$$

p+q=8-45; p/q=20-1000

(2') non-functional PFPE oils commercially available from Daikin under the trademark name DEMNUM®, said PFPEs generally comprising at least one PFPE complying with formula here below:

$$F\text{---}(CF_2CF_2CF_2O)_n\text{---}(CF_2CF_2CH_2O)_j\text{---}CF_2CF_3$$

j=0 or integer >0; n+j=10-150

(3') non-functional PFPE oils commercially available from Du Pont de Nemours under the trademark name KRYTOX®, said PFPEs generally comprising at least one low-molecular weight, fluorine end-capped, homopolymer of hexafluoropropylene epoxide complying with formula here below:

$$F\text{---}(CF(CF_3)CF_2O)_n\text{---}CF_2CF_3$$

n=10-60

The non-functional PFPE oil is even more preferably selected from those having formula (1') as described above.

The surfactant (FS) typically complies with formula (III) here below:

$$R_f(X^-)_k(M^+)_k \quad (III)$$

wherein:
- $R_{fs}$ is selected from a $C_5$-$C_{16}$ (per)fluoroalkyl chain, optionally comprising one or more catenary or non-catenary oxygen atoms, and a (per)fluoropolyoxyalkyl chain,
- $X^-$ is selected from —COO$^-$, —PO$_3^-$ and —SO$_3^-$ groups,
- $M^+$ is selected from NH$_4^+$ and an alkaline metal ion, and
- k is 1 or 2.

Non-limitative examples of surfactants (FS) suitable for the process of the invention notably include the followings:

(a) $CF_3(CF_2)_{n0}COOM'$, wherein no is an integer ranging from 4 to 10, preferably from 5 to 7, preferably no being equal to 6, and M' represents NH$_4$, Na, Li or K, preferably NH$_4$;

(b) $T-(C_3F_6O)_{n1}(CFXO)_{m1}CF_2COOM''$, wherein T represents a chlorine atom or a (per)fluoroalkoxide group of formula $C_xF_{2x+1-x}Cl_xO$, wherein x is an integer ranging from 1 to 3 and x' is 0 or 1, $n_1$ is an integer ranging from 1 to 6, $m_1$ is an integer ranging from 0 to 6, M'' represents NH$_4$, Na, Li or K and X represents F or —CF$_3$;

(c) $F—(CF_2CF_2)_{n2}—CH_2—CH_2—RO_3M'''$, wherein R is a phosphorus or a sulfur atom, preferably R being a sulfur atom, M''' represents NH$_4$, Na, Li or K and $n_2$ is an integer ranging from 2 to 5, preferably $n_2$ being equal to 3;

(d) A-$R_{bf}$—B bifunctional fluorinated surfactants, wherein A and B, equal to or different from each other, have formula —(O)$_p$CFX''—COOM*, wherein M* represents NH$_4$, Na, Li or K, preferably M* representing NH$_4$, X'' is F or —CF$_3$ and p is an integer equal to 0 or 1, and $R_{bf}$ is a divalent (per)fluoroalkyl or (per)fluoropolyether chain such that the number average molecular weight of A-$R_{bf}$—B is in the range of from 300 to 1800; and (e) mixtures thereof.

Preferred surfactants (FS) suitable for use in the process of the invention comply with formula (b) as described above.

The polymerization process of the invention typically results in an aqueous latex comprising the polymer (F) as defined above and at least one fluorinated surfactant [surfactant (FS)] as defined above.

The amount of polymer (F) as defined above in the latex directly resulting from the polymerization process typically ranges between 10% and 40% by weight, preferably between 20% and 30% by weight.

The polymer (F) as defined above is dispersed in the latex under the form of particles having an average size typically ranging between 50 and 200 nm, preferably between 60 and 150 nm, more preferably between 80 and 125 nm, as measured according to ISO 13321.

A composition comprising the polymer (F) as defined above and at least one fluorinated surfactant (FS) as defined above may be isolated from the latex by coagulation if a polymer in solid form is desired.

The Applicant has found that a composition comprising the polymer (F) as defined above and at least one surfactant (FS) as defined above, wherein said surfactant (FS) is present in an amount of advantageously less than 50 ppm, preferably of less than 30 ppm, more preferably of less than 10 ppm, may be successfully obtained by thermal treating the composition resulting from coagulation of the latex as defined above.

The thermal treatment is typically performed in suitable heating devices, generally electric ovens or convection ovens. The thermal treatment is carried out at temperatures typically up to 300° C., preferably up to 200° C., more preferably up to 100° C. The thermal treatment is carried out for a time typically of from 1 to 60 hours, preferably of from 10 to 50 hours.

A further object of the present invention is use of the polymer (F) of the invention as ferroelectric, piezoelectric, pyroelectric or dielectric material in electrical and electronic devices.

Non-limitative examples of electronic devices notably include transducers, sensors, actuators, ferroelectric memories, capacitors powdered by electrical devices.

Non-limitative examples of electrical devices notably include lithium ion batteries.

The polymer (F) of the invention is generally comprised in said devices under the form of bidimensional parts such as films and sheets.

Films or sheets of the polymer (F) of the invention can be manufactured according to standard techniques like, e.g., extrusion, injection moulding, compression moulding and solvent casting.

The Applicant has found that films and sheets of the polymer (F) of the invention, having a thickness of advantageously at most 100 μm, preferably of at most 60 μm, more preferably of at most 40 μm, may be successfully used in said electrical and electronic devices.

The bidimensional articles so obtained may be further submitted to post-processing treatments, in particular for enhancing ferroelectric, piezoelectric, dielectric or pyroelectric behaviour, like, e.g., annealing, stretching, bi-orientation and the like.

Bidimensional articles can be notably submitted to an high poling electric field obtained by polarization cycles for adjusting, in real time via high voltage and data acquisition computer controlled system, polarization, residual polarization and maximum displacement current measured at the coercive field. An embodiment of this process is described in ISNER-BROM, P., et al. Intrinsic piezoelectric characterization of PVDF copolymers: determination of elastic constants. *Ferroelectrics*. 1995, vol. 171, p. 271-279., in BAUER, F., et al. Very high pressure behaviour of precisely-poled PVDF. *Ferroelectrics*. 1995, vol. 171, p. 95-102., in U.S. Pat. No. 4,611,260 (DEUTSCH FRANZ FORSCH INST) Sep. 9, 1986 and in U.S. Pat. No. 4,684,337 (DEUTSCH FRANZ FORSCH INST) Aug. 4, 1987, whose disclosures are incorporated herein by reference.

Should the disclosure of any patents, patent applications, and publications which are incorporated herein by reference conflict with the description of the present application to the extent that it may render a term unclear, the present description shall take precedence.

The invention will be now described in more detail with reference to the following examples whose purpose is merely illustrative and not limitative of the scope of the invention.

Determination of Polymer Chain Ends

Polymer chain ends were determined according to the method described in PIANCA, M., et al. End groups in fluoropolymers. *Journal of Fluorine Chemistry* 1999, vol. 95, p. 71-84. Concentration of relevant chain ends are expressed both as mmoles per kg of polymer and as mmoles per kg of VDF.

Determination of Total Average Monomer (MA) Content

Total average monomer (MA) content in fluoropolymers was determined by acid-base titration.

A sample of 1.0 g of fluoropolymer was dissolved in acetone at a temperature of about 70° C. 5 ml of water were then added dropwise under vigorous stirring so as to avoid coagulation of the polymer. Titration with aqueous NaOH having a concentration of 0.01 N until complete neutralization of acidity was then carried out, with neutrality transition at about −170 mV.

Differential Scanning Calorimetry (DSC) Analyses

DSC analyses were carried out according to ASTM D 3418 standard method. $T_{m2}$ represents the melting temperature as measured in the second heating cycle. $T_{xx}$ represents the crystallization temperature as measured during intermediate cooling cycle. $T_{curie2}$ represents the Curie temperature as measured in the second heating cycle.

Determination of Thermal Stability

Thermal stability values were measured from thermogravimetric analysis (TGA) according to ISO 11358 standard method, under air, in a dynamic mode. Temperatures required for obtaining a weight loss of, respectively, 0.25% and 0.50% by weight of fluoropolymer were recorded. The higher these temperatures, the higher the thermal stability of the fluoropolymer.

Determination of Breakdown Voltage

Breakdown voltage values were measured according to ASTM D149-97a standard method on specimens of dielectric fluoropolymer films having a thickness of 10 μm. The higher the breakdown voltage values, the higher the voltage at which current begins to flow through the insulating dielectric fluoropolymer film.

Determination of Adhesion Strength

Adhesion strength properties of fluoropolymer films applied by casting on Q-panel aluminum test specimens were measured according to ASTM D3359-09 standard method. The rate numbers range on a scale of from 0B to 5B. The higher the rate number, the higher the adhesion strength of the fluoropolymer to the substrate.

EXAMPLE 1

Manufacture of a VDF-TrFE-AA Polymer

In an AISI 316 steel vertical autoclave equipped with baffles and stirrer working at 570 rpm, 3.5 lt. of demineralized water were introduced. When temperature reached set-point of 120° C., 32.5 g of a microemulsion obtained as described in Example 1 of U.S. Pat. No. 7,122,608 (SOLVAY SOLEXIS S.P.A.) Oct. 17, 2006 were introduced in the reactor together with 7.35 absolute bar of VDF. A gaseous mixture of VDF-TrFE (75/25% by moles) was then fed until reaching a pressure of 30 absolute bar.

Gas phase, before starting polymerization, was shown by GC analysis to possess the following composition (% by moles): 82.5% VDF, 17.5% TrFE. 30 ml of di-tert-butyl peroxide (DTBP) and 4 ml of a 2.5% by volume aqueous solution of acrylic acid (AA) were thus fed for initiating reaction. The polymerization pressure was maintained by continuously feeding above mentioned monomers mixture. After feeding 2% of the targeted amount of mixture, the temperature was lowered to 105° C. and 4 ml of a 2.5% by volume aqueous solution of acrylic acid (AA) was fed every 29 g of polymer obtained; feeding was disrupted once 288 g of the monomeric mixture were fed, and pressure was let falling down to 15 absolute bar maintaining a temperature of 105° C. The reactor was then vented, cooled to room temperature and the latex discharged and coagulated by freezing. The fluoropolymer obtained was washed with demineralized water and dried at 100° C. for 36 hours.

The residual surfactant in the fluoropolymer thus recovered was found to be 3 ppm as measured by GC analysis.

The fluoropolymer obtained was found to have a number average molecular weight ($M_n$) of 70500, a $T_{m2}$ of 142.3° C., a Curie temperature ($T_{curie2}$) of 111.0° C. and a $T_{xx}$ of 123.1° C.

EXAMPLE 2

Manufacture of a VDF-TrFE-AA Polymer

The same procedure as detailed in Example 1 was followed but:

25 ml of di-tert-butyl peroxide (DTBP) were fed;

the temperature was kept constant at 120° C.

Gas phase, before starting polymerization, was shown by GC analysis to possess the following composition (% by moles): 82.5% VDF, 17.5% TrFE. The residual surfactant in the fluoropolymer recovered as detailed in Example 1 was found to be 2.5 ppm as measured by GC analysis.

The fluoropolymer obtained was found to have a number average molecular weight ($M_n$) of 183000, a $T_{m2}$ of 138.5° C. and a Curie temperature ($T_{curie2}$) of 113° C.

EXAMPLE 3

Manufacture of VDF-TrFE-AA Polymer

The same procedure as detailed in Example 1 was followed but:

40 ml of di-tert-butyl peroxide (DTBP) were fed;

every 58 grams of polymer produced, 4 ml of a 1% by weight solution of ammonium persulfate were fed.

Gas phase, before starting polymerization, was shown by GC analysis to possess the following composition (% by moles): 82.5% VDF, 17.5% TrFE. The residual surfactant in the fluoropolymer recovered as detailed in Example 1 was found to be 4.2 ppm as measured by GC analysis.

The fluoropolymer obtained was found to have a number average molecular weight ($M_n$) of 79800, a $T_{m2}$ of 142.2° C., a Curie temperature ($T_{curie2}$) of 111.6° C. and a $T_{xx}$ of 120.8° C.

EXAMPLE 4

Manufacture of VDF-TrFE-CTFE-AA Polymer

The same procedure as detailed in Example 1 was followed but:

5.9 absolute bar of VDF and 0.45 absolute bar of CTFE were fed instead of 7.35 absolute bar of VDF;

35 ml of the microemulsion obtained as described in Example 1 of U.S. Pat. No. 7,122,608 (SOLVAY SOLEXIS S.P.A.) Oct. 17, 2006 were fed.

Gas phase, before starting polymerization, was shown by GC analysis to possess the following composition (% by moles): 81.6% VDF, 11.9% TrFE, 6.5% CTFE.

Then, 22 ml of di-tert-butyl peroxide (DTBP) and 2 ml of a 1% by volume aqueous solution of acrylic acid (AA) were fed.

The residual surfactant in the fluoropolymer recovered as detailed in Example 1 was found to be 0.5 ppm as measured by GC analysis. The fluoropolymer obtained was found to have a number average molecular weight ($M_n$) of 94330, a $T_{m2}$ of 123.4° C. and a Curie temperature ($T_{curie2}$) of 26.9° C.

COMPARATIVE EXAMPLE 1

Manufacture of VDF-TrFE Polymer

The same procedure as detailed in Example 1 was followed but:
- 27 ml of di-tert-butyl peroxide (DTBP) were fed;
- 35 ml of the microemulsion obtained as described in Example 1 of U.S. Pat. No. 7,122,608 (SOLVAY SOLEXIS S.P.A.) Oct. 17, 2006 were fed;
- no acrylic acid solution was fed.

Gas phase, before starting polymerization, was shown by GC analysis to possess the following composition (% by moles): 82.5% VDF, 17.5% TrFE. The residual surfactant in the fluoropolymer recovered as detailed in Example 1 was found to be 94 ppm as measured by GC analysis.

The fluoropolymer obtained was found to have a number average molecular weight ($M_n$) of 128000, a $T_{m2}$ of 144.5° C., a Curie temperature ($T_{Curie2}$) of 109.6° C. and $T_{xx}$ of 123.7° C.

COMPARATIVE EXAMPLE 2

Manufacture of VDF-TrFE-CTFE Polymer

The same procedure as detailed in Example 3 was followed but:
- 18 ml of di-tert-butyl peroxide (DTBP) were fed;
- 6.1 absolute bar of VDF and 0.4 absolute bar of CTFE were fed;
- no acrylic acid solution was fed.

Gas phase, before starting polymerization, was shown by GC analysis to possess the following composition (% by moles): 79% VDF, 14.8% TrFE, 6.2% CTFE.

The residual surfactant in the fluoropolymer recovered as detailed in Example 1 was found to be 102 ppm as measured by GC analysis. The fluoropolymer obtained was found to have a number average molecular weight ($M_n$) of 134200, a $T_{m2}$ of 126.9° C. and a Curie temperature ($T_{Curie2}$) of 30.6° C.

Relevant properties of polymers obtained as detailed hereinabove are summarized in Table 1 here below:

The data reported in Table 2 here below have shown that the fluoropolymers obtained according to Examples 1-4 of the invention exhibited enhanced breakdown voltage values as compared with the fluoropolymers obtained according to comparative Examples 1 and 2, the latters being free of recurring units derived from at least one (meth)acrylic monomer (MA).

Also, thermal stability values of the fluoropolymers obtained according to Examples 1-4 of the invention were found to be appreciably improved as higher temperatures were advantageously required to reach a weight loss of, respectively, 0.25% and 0.50% by weight, as compared with the fluoropolymers obtained according to comparative Examples 1 and 2.

Moreover, adhesion strengths values have shown that the fluoropolymers obtained according to Examples 1-4 of the invention were found to adhere very well to the surface of metal substrates such as aluminum substrates as compared with the fluoropolymers obtained according to comparative Examples 1 and 2.

TABLE 2

| Run | Thermal stability [° C.] 0.25% | Thermal stability [° C.] 0.50% | Breakdown voltage [Volt/μ] | Adhesion strength |
|---|---|---|---|---|
| Ex. 1 | 328 | 350 | 428 | 4B |
| Ex. 2 | 341 | 360 | 412 | 5B |
| Ex. 3 | 337 | 355 | 418 | 4B |
| Ex. 4 | 355 | 373 | 470 | 5B |
| C. Ex. 1 | 291 | 308 | 285 | 0B |
| C. Ex. 2 | 232 | 243 | 275 | 1B |

The fluoropolymers obtained according to Examples 1-4 of the invention were thus found to fulfil critical requirements to be successfully used in high power electronics and microelectronics applications.

The invention claimed is:

1. A fluoropolymer comprising:
   - recurring units derived from vinylidene fluoride (VDF);
   - from 10% to 50% by moles of recurring units derived from trifluoroethylene (TrFE); and
   - from 0.01% to 10% by moles of recurring units derived from at least one (meth)acrylic monomer (MA) having formula (I) here below:

TABLE 1

| Run | Ex. 1 | Ex. 2 | Ex. 3 | Ex. 4 | C. Ex. 1 | C. Ex. 2 |
|---|---|---|---|---|---|---|
| VDF [% mol] | 75.61 | 74.90 | 75.20 | 65.95 | 75.1 | 70.6 |
| TrFE [% mol] | 24.27 | 24.83 | 24.54 | 27.48 | 24.9 | 20.8 |
| CTFE [% mol] | — | — | — | 6.50 | — | 8.6 |
| AA [% mol] | 0.12 | 0.27 | 0.26 | 0.07 | — | — |
| MFI [g/10 min, ASTM D1238, 230° C., 5 Kg] | 40 | 0.25 | 32 | 18.6 | 3.5 | 4 |
| $M_n$ | 70500 | 183000 | 79800 | 94330 | 128000 | 134200 |
| Chain ends [mmol/kg of polymer] | | | | | | |
| —CF$_2$H (a) | 51 | 49 | 48 | 21 | 45 | 28 |
| —CF$_2$CH$_3$ (b) | 27 | 28 | 26 | 15 | 26 | 13 |
| total (a) + (b) | 78 | 77 | 74 | 36 | 71 | 41 |
| Chain ends [mmol/kg of VDF recurring units] | | | | | | |
| Total (a) + (b) | 110 | 110 | 105 | 62 | 101 | 69 |

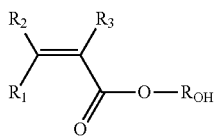

wherein:
R$_1$, R$_2$ and R$_3$, equal to or different from each other, are independently selected from a hydrogen atom and a C$_1$-C$_3$ hydrocarbon group, and R$_{OH}$ represents a hydrogen atom or a C$_1$-C$_5$ hydrocarbon moiety comprising at least one hydroxyl group, said fluoropolymer comprising end groups of formula —CF$_2$H and/or —CF$_2$CH$_3$.

2. The fluoropolymer of claim 1, wherein the (meth)acrylic monomer (MA) is acrylic acid (AA) or hydroxyethylacrylate (FLEA).

3. The fluoropolymer of claim 1, further comprising recurring units derived from one or more other fluorinated comonomers (F).

4. The fluoropolymer of claim 1, comprising end groups of formula —CF$_2$H and/or —CF$_2$CH$_3$ in a combined amount of at least 30 mmoles per kg of VDF recurring units.

5. The fluoropolymer of claim 1, consisting of:
from 40% to 85% by moles of recurring units derived from vinylidene fluoride (VDF),
from 10% to 50% by moles of recurring units derived from trifluoroethylene (TrFE), and
from 0.01% to 1% by moles of recurring units derived from at least one (meth)acrylic monomer (MA) having said formula (I).

6. The fluoropolymer of claim 5, consisting of:
from 45% to 83% by moles of recurring units derived from vinylidene fluoride (VDF),
from 15% to 48% by moles of recurring units derived from trifluoroethylene (TrFE), and
from 0.02% to 0.8% by moles of recurring units derived from said at least one (meth)acrylic monomer (MA) having formula (I).

7. The fluoropolymer of claim 1, consisting of:
from 40% to 85% by moles of recurring units derived from vinylidene fluoride (VDF),
from 10% to 50% by moles of recurring units derived from trifluoroethylene (TrFE),
from 2% to 20% by moles of recurring units derived from chlorotrifluoroethylene (CITE), and
from 0.01% to 1% by moles of recurring units derived from at least one (meth)acrylic monomer (MA) having said formula (I).

8. The fluoropolymer of claim 7, consisting of:
from 45% to 80% by moles of recurring units derived from vinylidene fluoride (VDF),
from 15% to 48% by moles of recurring units derived from trifluoroethylene (TrFE),
from 4% to 15% by moles of recurring units derived from chlorotrifluoroethylene (CTFE), and
from 0.02% to 0.8% by moles of recurring units derived from at least one (meth) acrylic monomer (MA) having formula (I).

9. A process for the manufacture of the fluoropolymer of claim 1, said process comprising polymerizing vinylidene fluoride (VDF), trifluoroethylene (TrFE), at least one (meth) acrylic monomer (MA) having said formula (I) and, optionally, one or more other fluorinated comonomers (F) in the presence of at least one radical initiator in a polymerization medium comprising:
water,
at least one fluorinated surfactant (FS), and
at least one non-functional perfluoropolyether (PFPE) oil.

10. The process of claim 9, wherein a mixture of one or more organic radical initiators and one or more inorganic radical initiators is used.

11. An electrical or electronic device comprising ferroelectric, piezoelectric, pyroelectric or dielectric material wherein the ferroelectric, piezoelectric, pyroelectric or dielectric material comprises the fluoropolymer of claim 1.

12. The electrical or electronic device according to claim 11, wherein the fluoropolymer is in the form of a film or sheet having a thickness of at most 100 μm.

13. The electrical or electronic device of claim 11, wherein the fluoropolymer is in the form of a film or sheet having a thickness of at most 40 μm.

* * * * *